United States Patent [19]
Suzuki et al.

[11] Patent Number: 5,955,780
[45] Date of Patent: Sep. 21, 1999

[54] CONTACT CONVERTING STRUCTURE OF SEMICONDUCTOR CHIP AND PROCESS FOR MANUFACTURING SEMICONDUCTOR CHIP HAVING SAID CONTACT CONVERTING STRUCTURE

[75] Inventors: Etsuji Suzuki; Hiroshi Odaira; Eiji Imamura, all of Kanagawa-ken, Japan

[73] Assignee: Yamaichi Electronics Co., Ltd., Tokyo, Japan

[21] Appl. No.: 09/063,270

[22] Filed: Apr. 21, 1998

[30] Foreign Application Priority Data

Apr. 23, 1997 [JP] Japan .................................... 9-106335

[51] Int. Cl.⁶ ................................................. H01L 23/48
[52] U.S. Cl. ............................................. 257/690; 257/741
[58] Field of Search ....................................... 257/690, 734, 257/741, 773

[56] References Cited

U.S. PATENT DOCUMENTS

| | | | |
|---|---|---|---|
| 4,761,677 | 8/1988 | Sasaki | 257/741 |
| 5,414,301 | 5/1995 | Thomas | 257/741 |
| 5,670,827 | 9/1997 | Sakuma et al. | 257/741 |

*Primary Examiner*—Teresa M. Arroyo
*Assistant Examiner*—Roy Potter
*Attorney, Agent, or Firm*—Weneroth, Lind & Ponack, L.L.P.

[57] ABSTRACT

A contact converting structure of a semiconductor chip comprises a semiconductor chip with a group of electrodes arranged on a surface of one side thereof. A liquid crystal polymer film is bonded to the surface in such a manner as to cover the electrodes group, and a group of external contacts is arranged on the other surface of the semiconductor chip. The external contacts group is connected to the electrodes group through the liquid crystal polymer film. A process for manufacturing a semiconductor chip having such a contact converting structure is also disclosed.

4 Claims, 3 Drawing Sheets

CONTACT CONVERTING STRUCTURE OF SEMICONDUCTOR CHIP AND PROCESS FOR MANUFACTURING SEMICONDUCTOR CHIP HAVING SAID CONTACT CONVERTING STRUCTURE

BACKGROUND OF THE INVENTION

This invention relates to a contact converting structure of a semiconductor wafer.

A semiconductor wafer comprises a plurality of semiconductor chips, and most of the semiconductor chips have groups of electrodes arranged in array along four or two sides of a lower surface thereof. Recently, it became customary for a group of electrodes to be uniformly arranged over an entire surface on the lower side of the semiconductor chip.

In case the arranged pitches of the semiconductor chips are very small, a need occurs to convert such pitches in order to correspond to the pitches of electrode connecting pads on a wiring circuit board on which the semiconductor chip is to be placed.

In addition, there is a further need for conversion to a ball-shaped contact structure or the like, which is suited for connection with an electrode connecting pad of a wiring circuit board.

A conventional technique aimed at packaging at a wafer level is shown, for example, in FIG. 1. In this conventional technique, a polyimide substrate 1 having a number of ball type contacts 2 comprised of solder balls are separately formed from a semiconductor wafer 3. The ball type contacts 2 of each polyimide substrate 1 are bonded to electrodes 5 of the semiconductor wafer through leads 6. Between the polyimide substrate 1 and the semiconductor wafer 3, a rubber-containing elastic resin is charged to form an elastic resin layer 4. The leads 6 and connecting portions at opposite ends thereof are embedded in the elastic resin layer 4, and thereafter, semiconductor chips are divided from the semiconductor wafer.

The above prior art makes it possible to convert the pitches and configuration of the electrodes of the semiconductor chips. In this art, it is necessary that the semiconductor wafer 3 and the polyimide substrate 1 are connected through the leads 6, the elastic resin is charged between the wafer 3 and the substrate 1, the elastic resin layer 4 is formed by charging the elastic resin between the wafer 3 and the substrate 1, and the ball type contacts 2 are formed. However, technical difficulties are encountered when carrying out a connecting operation in a very small space between the semiconductor wafer 3 and the polyimide substrate 1 through the leads 6. Although the above proposal for performing an interlayer connection through the leads 6 at the wafer level and charging the elastic resin between the wafer and the substrate is a remarkable technique for receiving attention in the respect that the packaging, the pitch conversion and the configuration conversion are intended at the wafer level, and in the respect that there is a provision of a stress easing mechanism caused by differences in thermal expansion, there still remain various problems in manufacturing technique and cost.

The typical problem involved in the above prior art resides in moisture absorbability of silicon rubber and polyimide commonly used with the above rubber-based elastic resin layer 4, elastic resin, for example.

Since a semiconductor chip obtained by dividing the wafer has the cut-out surfaces of the elastic resin layer 4 (silicon rubber, etc.) and the polyimide substrate 1 exposed or nearly exposed to the side surface, moisture tends to permeate into the elastic resin and the polyimide through the cut-out surfaces to cause adverse effects at the leads and their connecting areas, thus resulting in decreased reliability.

Moreover, since the above prior art is directed to a manufacturing process in which the polyimide substrate 1 having the ball type contacts 2 and the semiconductor wafer 3 are manufactured separately, an interlayer connection is performed in a very small gap between the substrate 1 and the wafer 3, and elastic resin is charged therebetween, the cost becomes high and in addition, the above-mentioned technical difficulties for manufacture are involved.

SUMMARY OF THE INVENTION

It is, therefore, an object of the present invention to provide a contact converting structure of a semiconductor chip and a process for manufacturing a semiconductor chip having such a contact converting structure, in which a packaging (pitch and configuration conversion of the electrodes) at the wafer level can be realized at a low cost properly and easily.

In order to achieve the above object, from one aspect of the present invention, there is essentially provided a contact converting structure of a semiconductor chip, comprising:

a semiconductor chip with a group of electrodes arranged on a surface of one side thereof;

a liquid crystal polymer film bonded to the surface in such a manner as to cover the electrodes group; and a group of external contacts arranged on the other surface of the semiconductor chip, the external contacts group being connected to the electrodes group through the liquid crystal polymer film.

It is preferable that the first-mentioned surface of the semiconductor chip and the surface of the liquid crystal polymer film are bonded together to form a bonded structure through a thermoplastic property of the liquid crystal polymer film.

It is also preferable that anchor means with respect to the liquid crystal polymer film is provided on the surface of the semiconductor chip where the electrodes group are arranged to thereby form a bonded structure with the liquid crystal polymer film.

According to another aspect of the present invention, there is provided a process for manufacturing a semiconductor chip having a contact converting structure, including the steps of:

bonding a liquid crystal polymer film to a surface of a semiconductor wafer composed of a plurality of semiconductor chips, the surface being arranged thereon with a plurality of electrodes;

drilling a plurality of through holes in the liquid crystal polymer film which is in bonded relation to the semiconductor wafer, the through holes extending thickness-wise all the way through the liquid crystal polymer film and reaching the electrodes;

forming an electrically conductive metal film on the other surface of the liquid crystal polymer film to the bonded surface thereof by at least one of the film forming processes including sputtering, vapor deposition, and plating and intimately contacting a part of the electrically conductive metal film to the electrodes through the through holes;

forming a lead pattern on the electrically conductive metal film by etching thereof; and obtaining a semiconductor chip by dividing the semiconductor wafer formed with the lead pattern.

It is preferred that an external contact is formed on the lead pattern on the semiconductor wafer.

A more complete understanding of the invention and many of the attendant advantages thereof will be readily obtained as the same becomes better understood by reference to the following detailed description when considered in connection with the accompanying drawings.

DETAILED DESCRIPTION OF THE EMBODIMENTS

Figure 1:
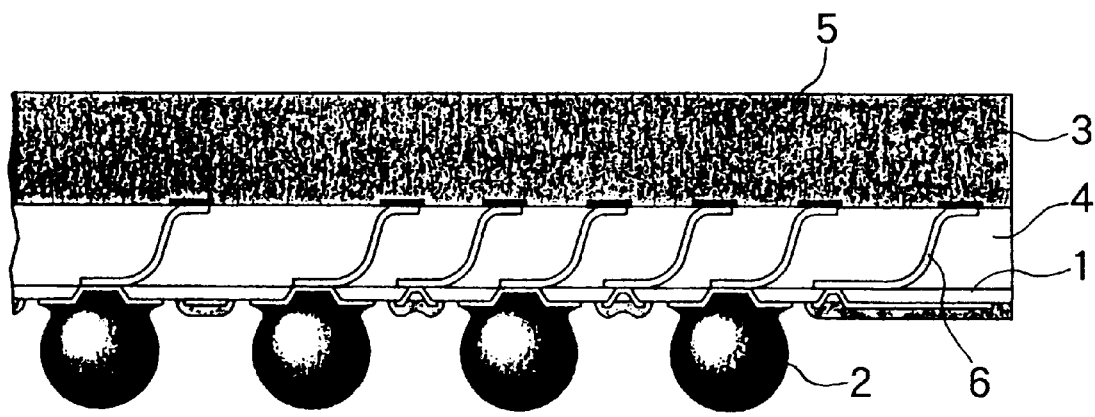
FIG. 1 is an enlarged sectional view showing a contact converting structure of a semiconductor chip according to the prior art.

Component elements of the total aromatic polyester-containing liquid crystal polymer ("Bectra" merchandise name of Kurare K.K.) are C, H, and O, having the following chemical constitution.

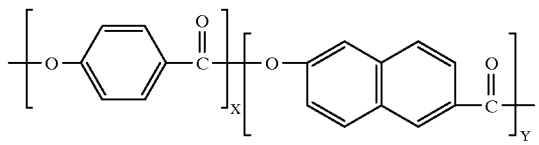

This liquid crystal polymer is a polymer which exhibits a molecular orientation like a solid crystal when in a molten state. This constitution is fixed as it is, thereby exhibiting various excellent properties.

One of the largest features of it is that its moisture absorbability is extremely small as 0.04%. For example, moisture absorbability of polyimide resin used in a wiring circuit board, etc. is 2.9%. Compared with this, the above liquid crystal polymer exhibits a moisture absorbability of one seventieth or less. The properties of the above liquid crystal polymer serve to provide a high moisture resisting property and contribute to enhancement of performance when the above semiconductor chips are packaged. Another great feature of it is excellent in thermal conductivity. The thermal conductivity in a planar direction of the polyimide resin is 0.2 w/m·°C., whereas that of the liquid crystal is 2.5 w/m·°C. (a thermal conductivity gauge KEMTHERM QTM-D3 was used for measurement in both cases). This means that thermal conductivity of the liquid crystal is 10 times or more that of polyimide. This property is useful to enhance heat radiating action of the semiconductor chips and protect the semiconductor chips which are fragile to heat.

The thermal expansion coefficient of the liquid crystal polymer is −7 to 60 ppm/°C. (measured by TMA), and the liquid crystal polymer is extremely good in thermal stability compared with resin for other electrical parts.

The thermal expansion coefficient can be controlled within the above range and can be brought as close as possible to the thermal expansion coefficient of the semiconductor wafer. Accordingly, no stress is applied to the electrode connecting portion of the semiconductor wafer and a high reliability of connection is ensured.

The liquid crystal polymer exhibits a favorable thermoplastic property and its base material welding to the surface of the semiconductor chip through the thermoplastic property is good and large in strength.

Particularly, since it is easily softened by heat, the stress caused by differences in thermal expansion when the packaged semiconductor chip is mounted on the wiring circuit board is absorbed by the surface softening, and no stress is applied to the connecting portion with respect to the electrodes of the semiconductor chip nor to the solder balls for joining the semiconductor package and the wiring circuit board. That is, the liquid crystal polymer serves as a stress cushioning material. Moreover, since the dielectric constant is low, a favorable high frequency characteristic can be provided.

As mentioned above, the properties of the liquid crystal polymer are extremely suited for use as a base material for forming an external contact for converting pitch and configuration by packaging the semiconductor chip and the semiconductor wafer. It brings about an improvement of performance and cost reduction for the semiconductor chip, and the packaging attempt at the wafer level enhances the actual practice at the commercial level.

Figure 2:
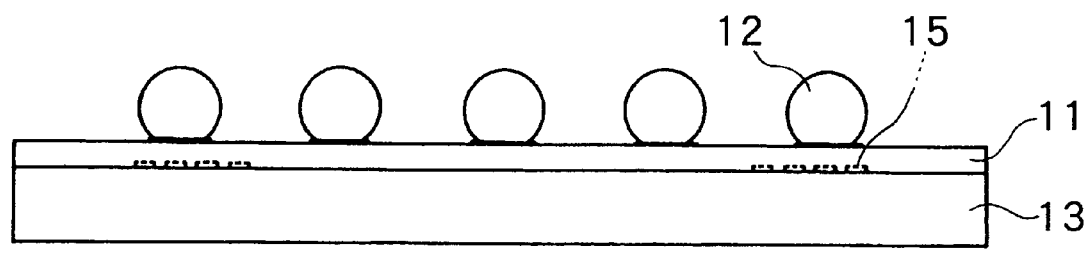
FIG. 2 is a side view of a contact converting structure of a semiconductor chip according to one embodiment of the present invention.

As shown in FIG. 2, the liquid crystal polymer film 11 is bonded to the surface of the semiconductor chip 13 on the side where the large number of electrodes 15 are arranged, in such a manner as to cover the electrodes 15. A large number of external contacts 12 corresponding to the electrodes 15 are arranged on a surface of the liquid crystal polymer film 11 on the side opposite the bonding surface thereof. The external contacts 12 and the electrodes 15 corresponding thereto are electrically connected to each other through the liquid crystal polymer film 11, so that those external contacts 12 can be used as connecting means when they are surface mounted to the wiring circuit board, or the like.

The external contacts 12 are represented by ball type contacts made of metal having a low melting point, such as solder, or the like. The liquid crystal polymer film is base material welded to the surface of the semiconductor chip 13 utilizing the thermal plastic property of the liquid crystal polymer.

Figure 3:
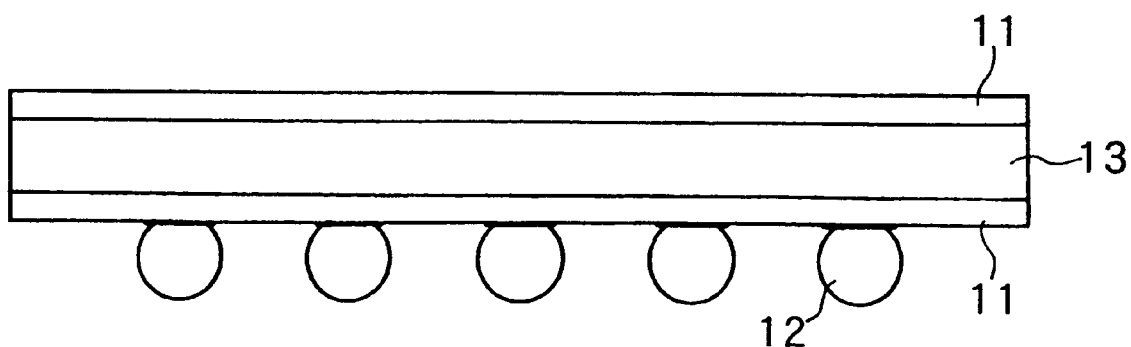
FIG. 3 is a side view of a contact structure of a semiconductor chip according to another embodiment of the present invention.

As shown in FIG. 3, the liquid crystal polymer film 11 can be bonded to the surface of the semiconductor chip 13 on the side where the electrodes 15 are arranged, and the other surface of the semiconductor chip 13.

By virtue of such a double surface bonding structure, even a minor warping of the semiconductor chip 13, which may occur to a single surface bonding structure, can be prevented.

When the liquid crystal polymer film 11 is bonded to a single surface or two surfaces of the semiconductor chip 13 through its thermoplastic property, anchor means comprised of fine projections 17 or the like is formed on the single surface or the two surfaces of the semiconductor chip 13 and the anchor means is caused to bite into the liquid crystal film 11 to thereby form a bonding structure.

In forming the fine projections, that is, in forming a coarse surface of the semiconductor chip 13 or the semiconductor wafer, the electrodes 15 or the nearby area including the electrodes 15 are masked in such a manner as to be covered with a photoresist, and the surface exposed from this mask is washed by oxide or treated using a shot blast. This coarse area can be disposed on any required place on the surface of the semiconductor chip 13, such as a periphery of the semiconductor chip 13.

The contact converting structure of the semiconductor chip 13 applied with the liquid crystal film as a base material for forming the contacts can be employed directly to a contact converting structure at the semiconductor wafer level.

That is, the properties of the liquid crystal polymer make it possible to properly practice the packaging at the semiconductor wafer level, and the pitch conversion and the configuration conversion can be carried out in a state where the bonding structure between the liquid crystal polymer and the semiconductor wafer is formed.

One example of the above will be described with reference to FIGS. 5(A)–5(f).

Figure 5A:
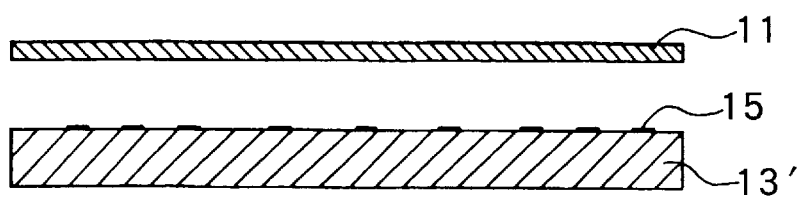
FIGS. 5(A) to 5(F) are sectional views sequentially showing a process for manufacturing the contact converting structure which is carried out at a semiconductor wafer level.
Figure 5B:
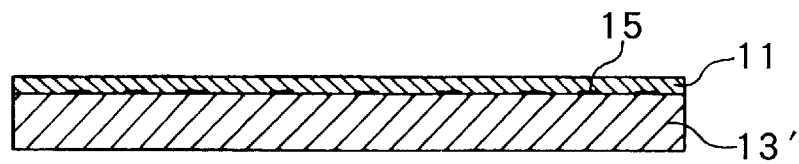

As shown in FIGS. 5A and 5B, the liquid crystal film 11 is bonded to the surface of the semiconductor wafer 13' on the side where the electrodes 15 are arranged, in such a manner as to cover the surface. Preferably, the liquid crystal polymer film 11 is base material welded to the surface of the semiconductor wafer 13' by its thermoplastic properties.

Figure 5C:
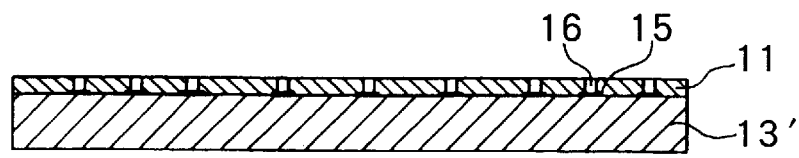
Figure 5D:
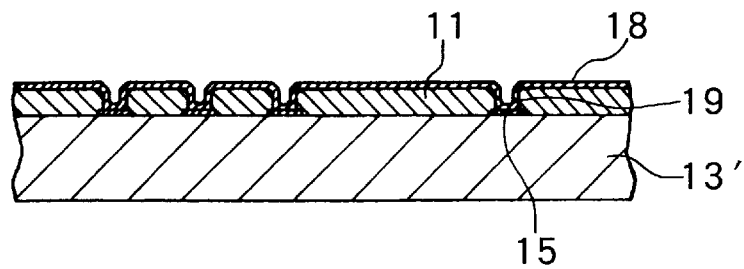

As shown in FIG. 5(C), a large number of through holes 16 extending in the thickness-wise direction of the liquid crystal polymer film 11 and reaching the electrodes 12 on the surface of the semiconductor wafer 13' are formed by means of excimer laser or the like, and then, as shown in FIG. 5(D), the electrically conductive metal film 18 is bonded in the form of layers to the outer surface of the liquid crystal polymer film on the other side to the bonded surface by sputtering, vapor deposition, or the like. Then, a part of this electrically conductive metal layer 18 is connected to the surface of each electrode 15 via the through hole 16 facing the electrode 15.

By doing so, the electrically conductive film 18 and the electrodes 15 are electrically connected through the connected portion 19 via the liquid crystal polymer film 11. This connected portion 19 is a continuous film intimately contacted to the inner peripheral surface of each through hole 16 and also intimately contacted to the surface of each electrode 15 by a method for forming a film of the electrically conductive metal film 18. The continuous film forms a recess having a bottom at an area where the through hole 16 is formed and intimately contacts the electrode 15 at the bottom portion. It is possible to form a connected portion 19 obtained by filling a part of the electrically conductive metal film 18 into the through hole 16.

Figure 5E:
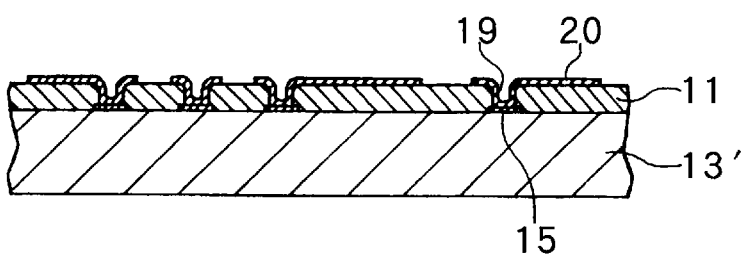

As shown in FIG. 5(E), a lead pattern 20 is formed by etching the electrically conductive film 18.

Figure 5F:
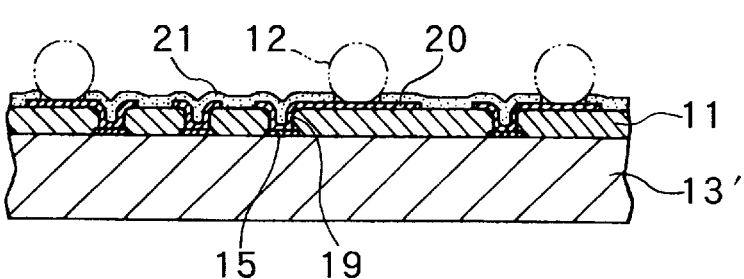

This lead pattern 20 is used for pitch converting the electrodes 15. As shown in FIG. 5(F), a ball type contact as represented by a solder ball, i.e., an external contact 12 is annexed to an end portion of the lead pattern 20, so that a configuration conversion of the electrodes 15 is carried out. This ball type external contact 12 is formed by heat melted metal. Although the base material for forming it is subjected to the effect of high heat, the present invention makes it possible to effectively prevent thermal expansion of the base material in case the external contact 15 as represented by the solder ball is formed, by applying the liquid crystal polymer film 11 as the base material, and to properly form the external contact 12 in a state where the liquid crystal polymer film 11 is directly bonded to the surface of the semiconductor wafer 13', at the wafer level.

By this, the packaging at the wafer level of the semiconductor can properly be put into practice. Then, the package of the semiconductor of FIG. 5(F) is divided to obtain the packaged semiconductor chip 13 having a contact converting function as shown in FIG. 2.

As shown in FIG. 5(F), a cover coat 21 may be applied to the outer surface of the liquid crystal polymer film applied with the lead pattern 20.

More specifically, FIGS. 5(A)–5(F) show process for manufacturing a semi-conductive chip having a contact converting structure, comprising the steps of: bonding a liquid crystal polymer film 11 to a surface of a semiconductor wafer 13' composed of a plurality of semiconductor chips, the surface being arranged thereon with a plurality of electrodes 15; drilling a plurality of through holes 16 in the liquid crystal polymer film 11 which is in bonded relation to the semiconductor wafer, the through holes 16 extending thickness-wise all the way through the liquid crystal polymer film 11 and reaching the electrodes 15; forming an electrically conductive metal film 18 on the other surface of the liquid crystal polymer film 11 opposite the bonded surface thereof by at least one of the film forming processes including sputtering, vapor deposition, and plating and intimately contacting a part of the electrically conductive metal film 18 to the electrodes through the through holes 16; forming a lead pattern 20 from the electrically conductive metal film 18 by etching thereof; forming an external contact on the lead pattern; and obtaining a semiconductor chip 13 by dividing the semiconductor wafer 13' formed with the lead pattern 20.

Also, there may be employed a process for manufacturing a semiconductive chip having a contact converting structure comprising the steps of bonding a liquid crystal polymer film 11 to a surface of: a semiconductor wafer 13' composed of a plurality of semiconductor chips, the surface being arranged thereon with a plurality of electrodes 15; drilling a plurality of through holes 16 in the liquid crystal polymer film 11 which is in bonded relation to the semiconductor wafer, the through holes 16 extending thickness-wise all the way through the liquid crystal polymer film 11 and reaching the electrodes 15; forming an electrically conductive metal film 18 on the other surface of the liquid crystal polymer film 11 opposite the bonded surface thereof by at least one of the film forming processes including sputtering, vapor deposition, and plating and intimately contacting a part of the electrically conductive metal film 18 to the electrodes through the through holes 16; forming a lead pattern 20 from the electrically conductive metal film 18 by etching thereof; forming an external contact on the lead pattern; obtaining a semiconductor chip 13 by dividing the semiconductor wafer 13' formed with the lead pattern 20; and forming an external contact from the lead pattern on the semiconductor chip thus divided.

As shown in FIG. 3, the liquid crystal polymer film 11 may be bonded to each surface of the semiconductor wafer 13' in the process of FIG. 5(B).

Figure 4:
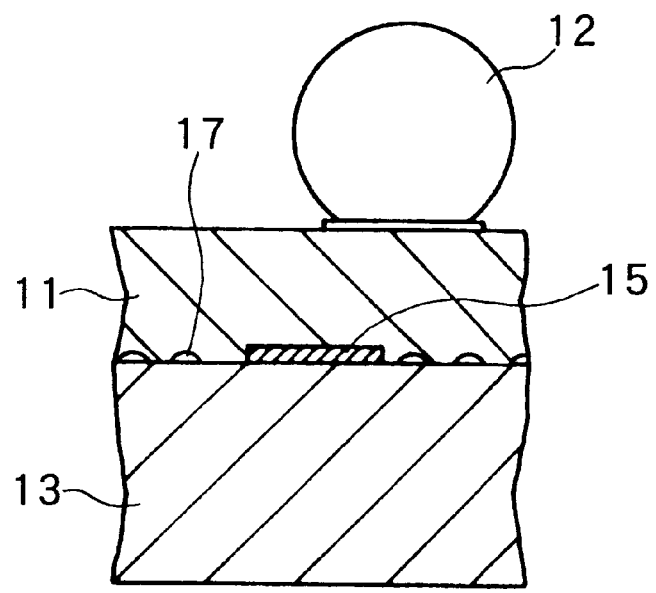
FIG. 4 is an enlarged sectional view of a contact converting structure according to a further embodiment of the present invention.

Also, as shown in FIG. 4, a large number of fine projections 17 may be formed on the surface of the semiconductor wafer 13' bonded with the liquid crystal polymer film 11, excluding the electrodes 15 prior to the process of FIG. 5(A) and the fine projections 17 may be caused to bite the liquid crystal film 11 so that the strength is enhanced.

The present invention is capable of enhancing the reliability with respect to moisture and heat and also significantly enhancing a high frequency performance by utilizing the liquid crystal polymer as a base material (base material for bonding the semiconductor chip or the semiconductor wafer) formed with the external contacts by utilizing the properties of the liquid crystal polymer.

Application of the liquid crystal makes it possible to perform a packaging (pitch conversion and configuration conversion of the electrodes) at the semiconductor wafer level properly, solving the problems of the manufacturing technique involved in the prior art, and achieving a cost reduction.

Obviously, numerous modifications and variations of the present invention are possible in light of the above teachings. It is therefore to be understood that within the scope of the appended claims, the invention may be practiced otherwise than as specifically described herein.

What is claimed is:

1. A contact converting structure of a semiconductor chip, comprising:

a semiconductor chip having first and second opposite surfaces, with a group of electrodes arranged on said first surface of said semiconductor chip;

a liquid crystal polymer film having first and second opposite surfaces, said first surface of said liquid crystal polymer film being bonded to said first surface of said semiconductor chip in such a manner as to cover said group of electrodes; and a group of external contacts arranged on said second surface of said liquid crystal polymer film, said group of external contacts being connected to said group of electrodes through said liquid crystal polymer film.

2. A contact converting structure of a semiconductor chip according to claim 1, wherein said first surface of said semiconductor chip and said first surface of said liquid crystal polymer film are bonded together to form a bonded structure through thermoplastic property of said liquid crystal polymer film.

3. A contact converting structure of a semiconductor chip according to claim 2, wherein anchor means with respect to said liquid crystal polymer film is provided on said first surface of said semiconductor chip to thereby form a bonded structure with said liquid crystal polymer film.

4. A contact converting structure of a semiconductor chip according to claim 2, wherein said first surface of said semiconductor chip is provided with anchor projections to form a bonded structure with said first surface of said liquid crystal polymer film.

* * * * *